United States Patent
Britz

(10) Patent No.: US 8,742,648 B2
(45) Date of Patent: Jun. 3, 2014

(54) METHOD AND APPARATUS FOR HARVESTING ENERGY BASED ON THE RANDOM OCCURRENCE OF COMMON DIRECTION MOLECULES

(75) Inventor: David Britz, Rumson, NJ (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 357 days.

(21) Appl. No.: 13/308,103

(22) Filed: Nov. 30, 2011

(65) Prior Publication Data
US 2013/0134718 A1    May 30, 2013

(51) Int. Cl.
*F03G 7/10* (2006.01)

(52) U.S. Cl.
USPC .................. 310/339; 290/11; 290/14; 290/44

(58) Field of Classification Search
CPC ............ H02N 2/18; F23Q 3/002; H01I 41/09
USPC .................................. 310/339; 290/11, 44, 55
See application file for complete search history.

(56) References Cited

U.S. PATENT DOCUMENTS

| | | | |
|---|---|---|---|
| 4,146,800 A * | 3/1979 | Gregory et al. | 290/44 |
| 4,404,490 A * | 9/1983 | Taylor et al. | 310/339 |
| 7,948,124 B1 * | 5/2011 | Waters et al. | 310/36 |
| 2003/0137220 A1 * | 7/2003 | Pinkerton | 310/339 |
| 2007/0018537 A1 * | 1/2007 | Pinkerton et al. | 310/339 |
| 2009/0295257 A1 * | 12/2009 | Wang et al. | 310/367 |
| 2011/0127776 A1 * | 6/2011 | Schulte | 290/1 A |

* cited by examiner

*Primary Examiner* — Derek Rosenau
*Assistant Examiner* — Bryan Gordon

(57) ABSTRACT

An energy collecting device is disclosed. For example, the energy collecting device comprises a plate layer having a plurality of perforations for receiving a plurality of molecules, a molecular energy collecting layer, coupled to the plate layer, having an impacting structure for receiving the plurality of molecules, and a substrate layer, coupled to the molecular energy collecting layer, having a conductor wire coil for collecting electrons that are generated when the plurality of molecules impacts the impacting structure.

20 Claims, 6 Drawing Sheets

US 8,742,648 B2

METHOD AND APPARATUS FOR HARVESTING ENERGY BASED ON THE RANDOM OCCURRENCE OF COMMON DIRECTION MOLECULES

The present disclosure relates generally to a method and apparatus for providing nanoscale energy harvesting based on the random occurrence of common direction molecules.

BACKGROUND

Sensor networks (or sensor clouds) may comprise a plurality of wireless sensors that are tasked with performing various functions, e.g., security or monitoring functions (e.g., motion sensors, infrared sensors, light sensors, etc.), medical monitoring functions (e.g., temperature sensors, humidity sensors, heart rate sensors, oxygen sensors, gas sensors, etc.) and the like. Powering these sensors can be provided with efficient batteries, but these batteries must be replaced regularly to ensure that the sensors will operate properly. Failure to replace these batteries may create a security or medical issue.

SUMMARY

In one embodiment, the present disclosure provides an energy collecting device. For example, the energy collecting device comprises a plate layer having a plurality of perforations for receiving a plurality of molecules, a molecular energy collecting layer, coupled to the plate layer, having an impacting structure for receiving the plurality of molecules, and a substrate layer, coupled to the molecular energy collecting layer, having a conductor wire coil for collecting electrons that are generated when the plurality of molecules impacts the impacting structure.

BRIEF DESCRIPTION OF THE DRAWINGS

The teaching of the present disclosure can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
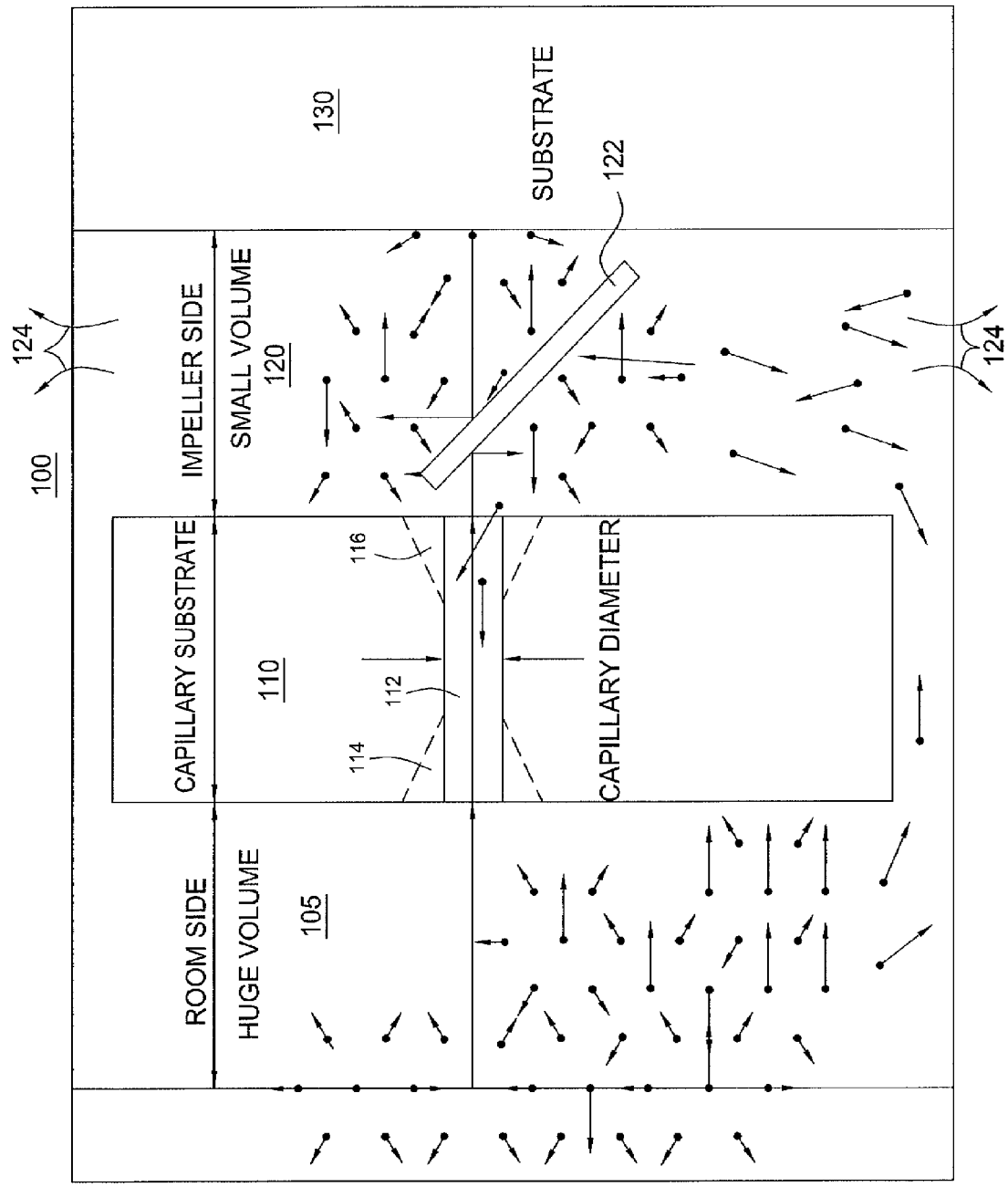
FIG. 1 illustrates a three layer microscopic construction or device for collecting molecular energy.

Wireless sensor networks (or sensor clouds) backhauled by cellular and Wi-Fi technologies are being developed. In one example, sensor clouds are composed of low bandwidth sensor devices connected to a network (e.g., a wireless or cellular network) via wireless devices such as Zigbee technology. The sensor devices can be worn (e.g., in medical applications) and or embedded and distributed in the environments (e.g., in buildings, walls, hallways, ceilings, in security or monitoring applications), where the users/customer may live and work. There is great potential for managed services such as security and remote medical monitoring services (among many other market applications) that will greatly benefit from the use of low cost and low powered wireless sensor devices.

Although sensor technologies can be very energy efficient, providing years of battery powered functional service, built-in sensor grids may need a long term operational service life (e.g., in terms of decades). Such operational durations and limited access (e.g., embedded in structures that are difficult to access easily) would benefit from a locally powered sensor device that can harvest local energy sources, e.g., nano-energy sources, without the need for battery replacement.

For example, improving device efficiencies and driving operating voltages toward lower voltages, e.g., 1 volt DC, enable ambient energy harvesting that could be used as a means to power these devices. For example, by continuously trickle charging an onboard storage device with electrical energy derived directly from nano-scale generators operating in the ambient environment, these devices will not require costly backup power from a wired main power source or replaceable batteries.

The ambient terrestrial environment represents a rich environment of temperature driven motion of both macroscopic and microscopic matter. On the macroscopic scale, this thermally driven matter motion includes flowing rivers, ocean currents, geothermal and wind sources, among many other examples. These thermal motion sources provide the means to produce large quantities of electric current via a conversion of the linear motion of matter into rotational energy that drives e.g., electric generating turbines.

However, matter at the microscopic molecular scale is also thermally driven, but to even higher velocities. Even at room temperature, the average gas (air) molecule is moving at between 700 to 1000 meters per second depending on the temperature and molecular mass. Normal sea level atmospheric pressure of approximately 14 lbs per square inch can equally be thought of as the gas pressure or the summed impact pressure of a huge number of these high velocity atmospheric (gas) molecules impacting on the square inch of surface area. As a summed force, the huge number of impacting air molecules represents an enormous energy resource, not unlike that of the above macroscopic examples of motion of matter. Though molecules individually represent a tiny energy source, the huge number of high speed molecules available in ambient air, if selected for direction and summed collectively to provide a force, then this force could be utilized to generate electrical output on a scale that could be used to continuously trickle charge low powered devices such as wireless sensors.

Unlike macroscopic scale energy sources, free flowing air molecules on the nanoscale are moving in chaotic and random directions such that, in mass, and at large macroscopic scales their individual motions are perfectly balanced out and there is no net direction or flow of this matter in the bulk volume of air. As such, there is not an applied gas-pressure force in any preferred direction, but on average, there is a gas-pressure force in all directions simultaneously.

At the molecular scale, the individual gas molecules are each moving ballistically, and in straight lines, and in random directions and do so until they impact another air molecule or other aggregation of molecules such as a container wall, this period and distance of this uninterrupted ballistic motion is referred to as the free path, and approximates 90 molecular diameters in length. In free air conditions, the high velocity molecules elastically bounce off one another, loosing little energy or velocity since the other molecules that they impacted are equally thermally charged.

The gas molecules contained in a pressurized gas tank exerts their summed gas pressure (molecular motion) on the tanks inner walls. In this scenario, the higher the number of gas molecules that are within a given volume, the closer the molecular spacing is between these molecules. This closer molecular proximity increases the number of impacts that a molecule will have with other molecules per unit time and thus increases apparent random motion of the molecules contained within the volume. This, in turn, means more molecules, per unit time, are impacting with the tank's inner wall at a greater rate than at a normal air pressure and thus applying a greater impact (gas-pressure) summed force on the container's walls. Thus, the more randomly moving gas molecules per unit volume there are, the greater the combined exerted gas pressure on the container walls.

According to the Chapman-Enskong theory, the average air (gas) molecule diameter is roughly 0.5 nanometers, with a spacing between molecules of 3.3 nanometers or approximately 7 molecular diameters at standard sea level temperature. The molecule and clear space around the molecule would be a diameter equal to 3.3+0.5+3.3=7.1 nanometers and occupy a clear volume of be approximately 150 cubic nanometers, thus defining a volume sphere with a diameter of 7.1 nanometers and equal to 14.2 molecule diameters. At standard temperature and pressure, the molecule is traveling at or above 700 meters per second, will on average move away from other nearby molecules, and will travel approximately ninety (90) molecular diameters or 45 nanometers before impacting with another molecule. It should be noted that this molecular spacing and velocity estimations will vary with temperature and localized air pressure.

If the huge number of gas molecules summed motion was not random but are directed, then this molecular flow, like on the macroscopic scale, will provide an effective force to induce motion in other objects. The potential for useful work to be generated from the motion of directed gas molecules will depend on the means to control the desired direction, the gas temperature and the number of gas molecules summed together to provide a force to do work. To do work, gas molecules in mass, would need to flow from one location to another in a controlled linear direction. Unfortunately, this is clearly not the case for the average atmospheric gas molecule, where random motion and direction is the norm.

As was discussed above, the average air molecule moves in a volume of empty space of about 150 cubic nanometers or a sphere with a diameter of 7.1 nanometers or 14.2 molecule diameters, and flies in a straight trajectory for about 90 molecular diameters before impacting another molecule and being diverted. The molecule's individual motion is ballistic and independent of other nearby molecules, i.e., they have no influence on the molecule's motion until an eventual impact with the molecule. Thus, the free flying molecule is simply unaware and not influenced by any of its neighbor molecules for the duration of its free path ballistic flight If the molecule's direction of free path is truly random, then from the start of its free path flight an infinite number of possible radiant directions can be considered. In turn, this infinite range of possible directions could be represented by a sphere with a spherical surface located 90 molecular diameters from the molecules origin point. Within this motion probability volume, the molecule has free motion and an infinite number of possible defined vector paths, but it will take one of these paths.

If one were to use the approximately 14.2 by 90 intermolecular spacing and free path length as a reference guide to determine how many molecules are traveling in a favorable direction within a given volume of molecules, this 14.2 by 90 dimension could be seen as a triangle with the apex at the molecules origin, the 90 dimension being the height of the triangle and the 14.2 dimension as the base of the triangle. The triangle could be rotated in 3 dimensions to form a cone—defining the 3 dimensional motion path the molecule could take within in the spherical volume of the motion probability sphere.

The ratio of surface areas between the molecules motion cone and the surface area of the motion probability sphere approximates the ratio of molecules traveling in a favorable free path direction within a given volume of molecules Thus, at any one moment of a molecular free path flight within a volume reservoir of free air, a certain percentage of the huge number of free flying molecules within this volume space will have the same or similar trajectory (but different locations within this volume space). If the common directions of these uncorrelated and random molecules are summed together within the free path distance and duration, then their combined linear molecular motion could be used to do work within the free path distance criteria, or multiple free path distances as long as some means is provided so that they are not interfered with by other random moving molecules within their free path passage.

One could say that these co-directional moving molecules are flying in formation in among a random swarm of molecules, in a common direction but they remain uncorrelated to each other in any way, i.e., a random occurrence of common direction. In one estimation, this random occurrence of common direction will only exist for the free path distance of 90 molecular diameters, before molecular collisions break up individual molecules motion within the formation. But for the particular free path period of time and distance, these molecules are actually moving through their free path distance in a common direction. If the momentum of these molecules can be commonly collected and presented to a common energy converting device, then their summed energy can be collected to do work.

Figure 2:
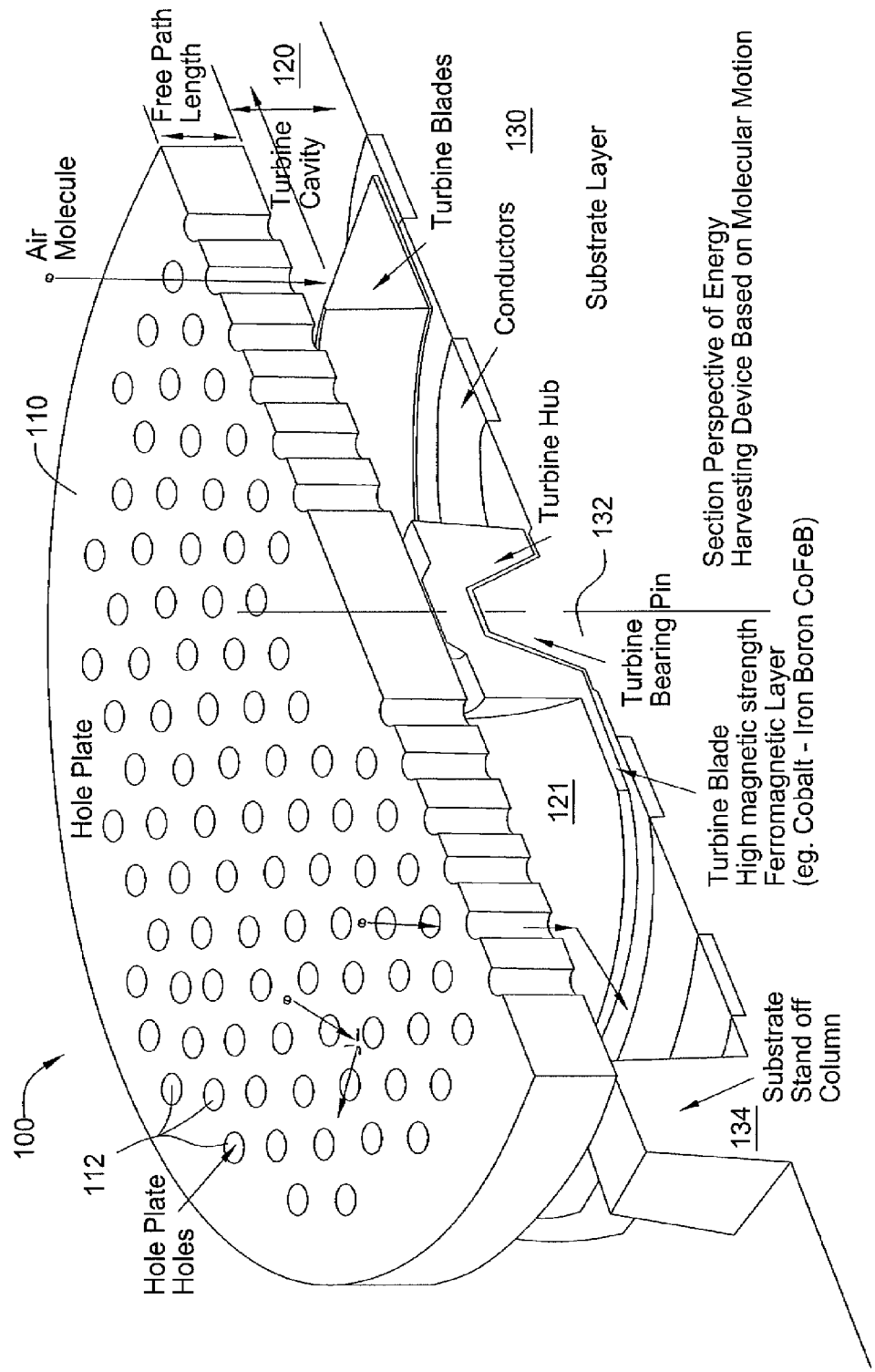
FIG. 2 illustrates a cut-out isometric view of the device for collecting molecular energy.

In one embodiment, the present disclosure exploits the availability of molecular scale machines and structures to harvest the energy of molecular collisions. In one embodiment of the present disclosure, FIG. 1 illustrates a three layer microscopic construction or device 100 for collecting molecular energy. FIG. 2 illustrates a cut-out isometric view of the device 100 for collecting molecular energy. The reader is encouraged to refer to both FIG. 1 and FIG. 2 simultaneously to gain understanding of the present disclosure.

In one embodiment, the device 100 comprises a three layer microscopic construction, with the first layer 110 being a plate or a capillary substrate with an array of through-hole perforations or simply holes 112 (only one perforation is shown in FIG. 1 for clarity), where each perforation may have a diameter of approximately 14.2 molecules or approximately 7.1 nanometers and spaced 20 molecule diameters or 10 nanometers apart. It should be noted that this illustrative size and spacing relationship may vary based on a particular application. The hole lengths would also match the free path length of 90 molecular diameters, though this may also vary based on applications.

In one embodiment, the second layer 120 comprises a molecular energy collecting/converting layer, e.g., in this example a nano scale multi-blade turbine (broadly an impacting structure), and the third layer 130 comprises the device substrate with a pinion or turbine bearing pin 132 that is designed to secure the turbine 121 with one or more impeller or turbine blades 122 but allow the turbine 121 to freely rotate while being sandwiched between the plate layer and the substrate layer. The substrate layer 130 would also provide columns 134 suitably positioned to hold and secure the plate layer 110 above the turbine 121 but also offer the maximum clear circumferential aperture beneath the plate to provide a clear unobstructed path for exhaust (exiting) molecules. All such layers could be fabricated using well known silicon fabrication processes as well as with other emerging materials such as graphene. Thus, the device 100 could be built repetitively in large numbers on silicon wafers and standard processing techniques with their individual electrical outputs available individually or aggregated.

It should be noted that in one embodiment, the perforation 112 may optionally employ a tapered opening 114 on the exterior side or room side of the first layer 110. This tapered opening 114 may assist in collecting a greater number of molecules coming in on non perpendicular paths to enter the perforation 112 and change their transit path angle to a more beneficial angle to maximize energy transfer. Similarly, the perforation 112 may optionally employ a second tapered opening 116 on the interior side or impeller side of the first layer 110 to adjust the transit path angle and assist the exit of the molecules to impact the turbine blade at an optimally defined angle 122 to maximize energy transfer.

In operation, high velocity molecules will approach the plate surface from a broad range of directions. Those molecules within 90 molecular diameters of the plate surface that are moving linearly will likely continue their motion and direction into the holes 112 in the plate 110 unimpeded by the random motions of other molecules. The molecules that line up with the plates holes will easily enter the holes and transit the holes length without encountering other random motion molecules. Those molecules that do not line up with the plate holes, or are not near perpendicular to the holes, are more likely to meet the plate's solid surface and be deflected away, i.e., they will not likely enter the plate's holes, and the room side hole taper will help to eject them away.

The molecules that do enter the plate holes 112 will likely transit the length of the hole. While in the hole, the molecules are thus protected from further impact with other freely and randomly moving molecules except for other molecules also in the same hole travelling in the same or opposite general direction, but the likelihood of impacting another molecule within the hole volume is small, requiring a near perfect molecule to molecule alignment impact to eject the molecules out of the hole. The molecules will exit the plate layer 110 with a similar trajectory and velocity as they had entered the holes. As the molecules exit the hole plate layer, they will enter into the cavity of the turbine cavity layer 120 with another "new" 90 molecular diameter free path trajectory. The exiting ballistic molecules will then impact the surface of one of the shaped fan blades 122 of the turbine 121, thereby imparting momentum to the blade and then bouncing off the blade to eventually exit the turbine cavity layer 120 through the peripheral circumference aperture 124 and returning to the general volume of air molecules in the room side. The summing of a large number of these molecules impacting the turbine blades 122 after exiting the holes will apply an unbalanced rotational force to the turbine blades, offsetting the motion neutralizing effects of the random motion molecules already in the turbine space. The unbalance molecular impact force thereby forces the turbine 121 to spin at a rate balanced to the throughput rate of the molecules transiting the plate holes and their exiting of the device all together 100.

It is entirely possible that some random moving molecules will enter the holes in the plate substrate 110 in the reverse direction, i.e., entering the holes 112 from the turbine cavity direction. However, since the volume of the turbine cavity 120 is very small compared to the free volume 105 on the open side of the hole plate 110, and the energy harvesting device (turbine) itself occupies a large portion of the volume, and for a given air pressure and molecular spacing, there are significantly fewer random moving molecules available in the remaining turbine cavity volume to enter into the holes 112 in the wrong direction. Additionally, the hole diameter is ~14.2 molecule diameters, or 7.1 nanometers in size. Thus, there is sufficient free space within the hole for molecules to pass each other without contact. As such, there is lower probability that a directionally inbound molecule will make contact and be deflected out of the hole by a molecule travelling in the wrong direction.

In one embodiment, the plate holes 112 and the plate thickness are designed to reflect the intermolecular spacing and 90 molecule free path distances encountered by the molecule in normal uninterrupted free flight, thereby increasing the likelihood that there will be little to no influence from other molecules on the trajectory of the molecules' ballistic approach when entering into the plate hole. This plate hole layer 110 is designed not to influence the molecules' free flight trajectory entering and transiting the hole, but the plate surface is designed to deflect molecules that alternatively are not on a suitable trajectory to enter and transit the hole. This sieve-like process is passive, thereby drawing on the molecules' existing trajectory to impact the turbine. The present arrangement allows for an opportunistic directionality of the molecules motion in terms of entering, transiting and emerging from the holes. Additionally, this random occurring directional filtering process will not require external power to produce the molecular directionality. The limitation for such a device is that at any one moment only a few percent of all the molecules approaching the plate surface will have the correct approach angle, and the chance to get through the plate holes to produce work.

In one embodiment, the plate surface area can be quite large compared to its thickness and limited only by the material's structural integrity and fabrication processes. For example, the hole plate's surface area may increase by the square of the plate radius, thereby greatly increasing the number of hole available and thus providing a large summed aperture to capture a large number of suitably orientated molecules. The system energy gain can be considered the ratio of the summed collecting aperture of the hole plate compared to the collecting aperture of the circumferential aperture of the turbine cavity. The primary limit to diameter of hole plate and surface area may be the limits of the energy converting device itself, i.e., the turbine's increasing size, mass, atomic stiction and the inertia of the turbine and its blades as the turbine's overall size is increased to match the hole plate.

In one embodiment, the plate material could be made from a number of commonly available materials such as silicon, but also including materials such as coherently stacked layers of grapheme.

Figure 4:
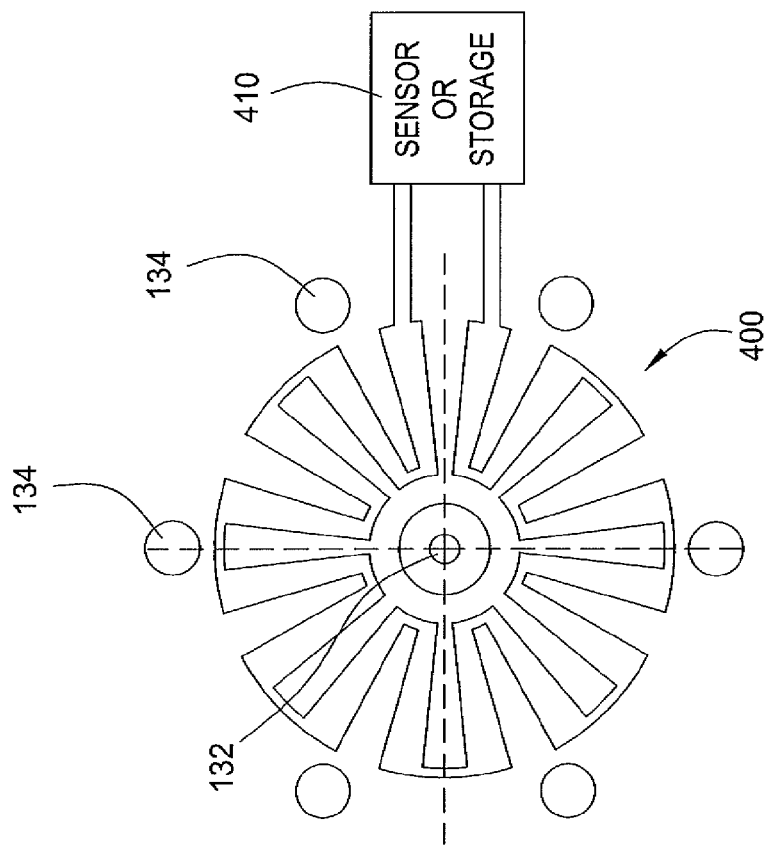
FIG. 4 illustrates an example embedded conductor in accordance with one embodiment of the present invention.
Figure 3:
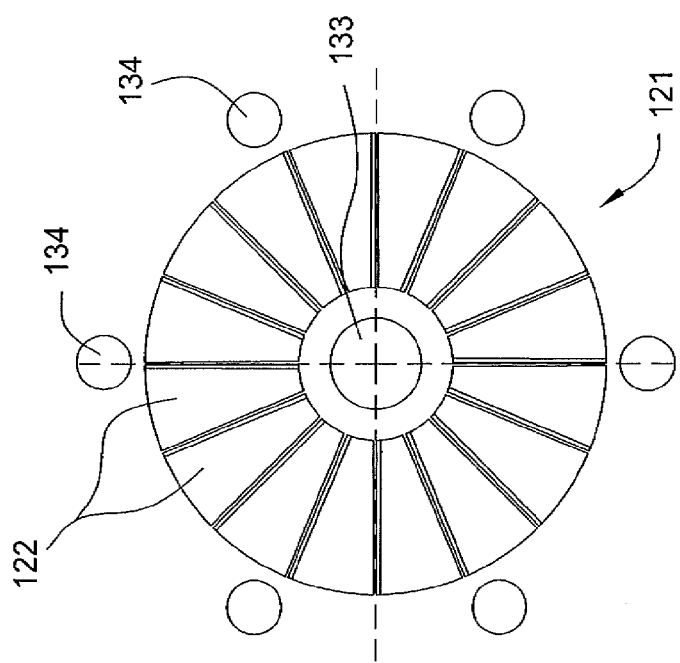
FIG. 3 illustrates an example turbine in accordance with one embodiment of the present invention.

FIG. 3 illustrates an example turbine 121 in accordance with one embodiment of the present invention. FIG. 4 illustrates an example embedded conductor 400 in accordance with one embodiment of the present invention. The reader is encouraged to refer to both FIG. 3 and FIG. 4 simultaneously to gain understanding of the present disclosure.

In one embodiment, the device 100 provides the means for molecules to flow in a controlled direction such that the molecules impinge on blades of a suitably positioned turbine. The blade shape and orientation is designed to extract the maximum energy from this flowing stream of uncorrelated molecules. The turbine blades and structure is designed to convert the molecules' linear motion into rotational motion. The turbine is then mechanically connected to an electrical generator that utilizes the rotational energy derived from the turbine to rotate magnets attached to the turbine blades, against conductor wires. For example, the generators' magnets and magnetic field repeatedly sweep across a conductor wire coils, thereby generating free electrons in the conductor. These electrons in mass can then be collected, stored and used to do work elsewhere.

In one embodiment, the turbine 121 comprises a central hub and bearing 133 designed to rotate on the axel pin 132 formed in the substrate layer 130. The multiple fan blades 122 will be placed radially to the hub 133. The multiple fan blades 122 will be designed to cover as much surface area, and as much of the underside of the hole plate as possible. This will engage the largest number of ballistic molecules in their energy transfer to the turbine 121 as well as restrict the number and the flow of molecules in the reverse direction.

Figure 5:
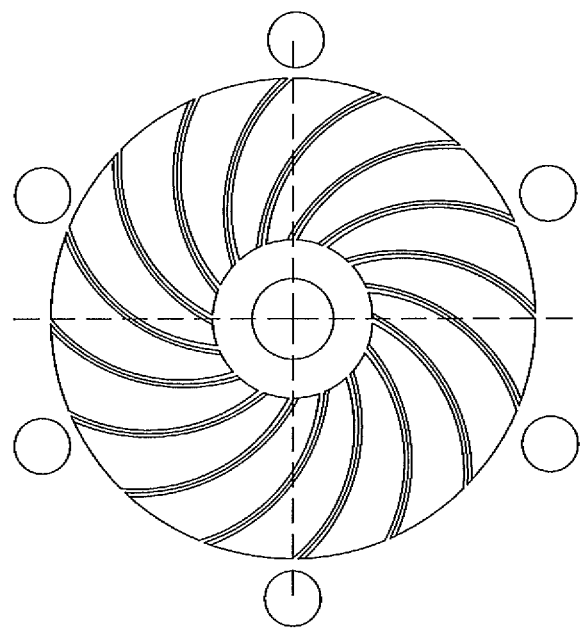
FIG. 5 illustrates an alternate example turbine in accordance with one embodiment of the present invention.

In one embodiment, the blade's contact surface will be tilted to an angle optimum for energy transfer between the molecule and the blade 122. In one embodiment, the blade can also be radially curved as shown in FIG. 5. The curved blades are designed to deflect the molecules radially away from the hub and blades so the deflected molecules will exit the turbine cavity as quickly as possible through the device's circumferential aperture, and so as not to interfere with the rotating blades.

At the bottom layer of each turbine blade will be a layer of magnetic material, or the blade itself may be milled from a suitable high field strength magnetic material. Thus, as the turbine rotates, due to molecular impacts (i.e., pressure), the turbine blades' magnetic components and magnetic field will rotate as well. The complex shape of the turbine and fan blades could be chemically or otherwise milled from silicon or suitable high field strength magnetic material using standard fabrication techniques.

In one embodiment, the substrate layer 130 may also be produced by standard silicon fabrication process, i.e., milling both the central turbine bearing pin 132 and the hole plate mounting columns 134. Around the central pin will be deposited an optimized conductor circuit track 400, that will be co-located near the magnetic layer of the turbine blades and designed to maximally engage with the blades' rotating magnetic fields to induce free electrons. The electrical output from this arrangement can be directed to receiving devices (e.g., sensors 410) elsewhere on the substrate or ganged with other generators (See FIG. 7) for power aggregation and/or to a storage device 410. This silicon layer can be designed to accommodate one or multiple molecular turbines commonly located on the substrate.

In one embodiment, to minimize the balancing effects of the randomly moving air molecules at atmospheric pressure and the temperature inside the turbine cavity, the collecting area of the combined holes in the hole plate must significantly exceed the turbine cavity's peripheral circumferential area. The system design thus provides more opportunity for air molecules to enter the turbine cavity via the plate holes, than random motion molecules leaking in from around the circumference of the turbine cavity. It should be noted that the surface area of the hole plate can grow by the square compared to its circumference, and favoring large plate diameters compared to circumferential apertures.

In one embodiment, the shape and motion of the turbine blades is designed to expel the post impact air molecules radially away from the device and through the open circumferential aperture of the turbine cavity where they will encounter randomly moving ambient air molecules.

In one embodiment, the spacing between the hole plate and the substrate layer would approximately be on the order of 90 molecular diameters or a few multiples thereof. This limited cavity space is designed so as to limit the cavity volume to the free path dimensions and thus have fewer random moving molecules (at air pressure) available within the cavity volume surrounding the turbine to interfere and neutralize the turbine motion and molecular turbine exhaust. The narrow cavity spacing also provides a significantly smaller circumferential aperture compared to the hole plate surface area and associated array of holes.

Thus, the design of the device 100 is to provide a large summed hole plate aperture so as to increase the probability that significantly more common-direction-molecules can reach the turbine cavity through the plate holes than random motion molecules entering the cavity via the circumference aperture.

This intentional imbalance of collecting apertures and volume reserves will help minimize the number of random moving molecules moving into the turbine cavity from outside of the cavity circumference, thus providing net gain in energy transfer to the turbine. Ideally, the number of plate holes available to bring in molecules from the vastly larger free air volume 105 that is external to the plate 110 will far exceed the free path spacing area around the circumference of the device 100. This difference in molecules entering the turbine cavity would likely produce a force equivalent to a "pressure differential" in the turbine cavity that will help drive the exhaust molecules from the cavity volume through increased inter-molecule collisions.

Figure 6:
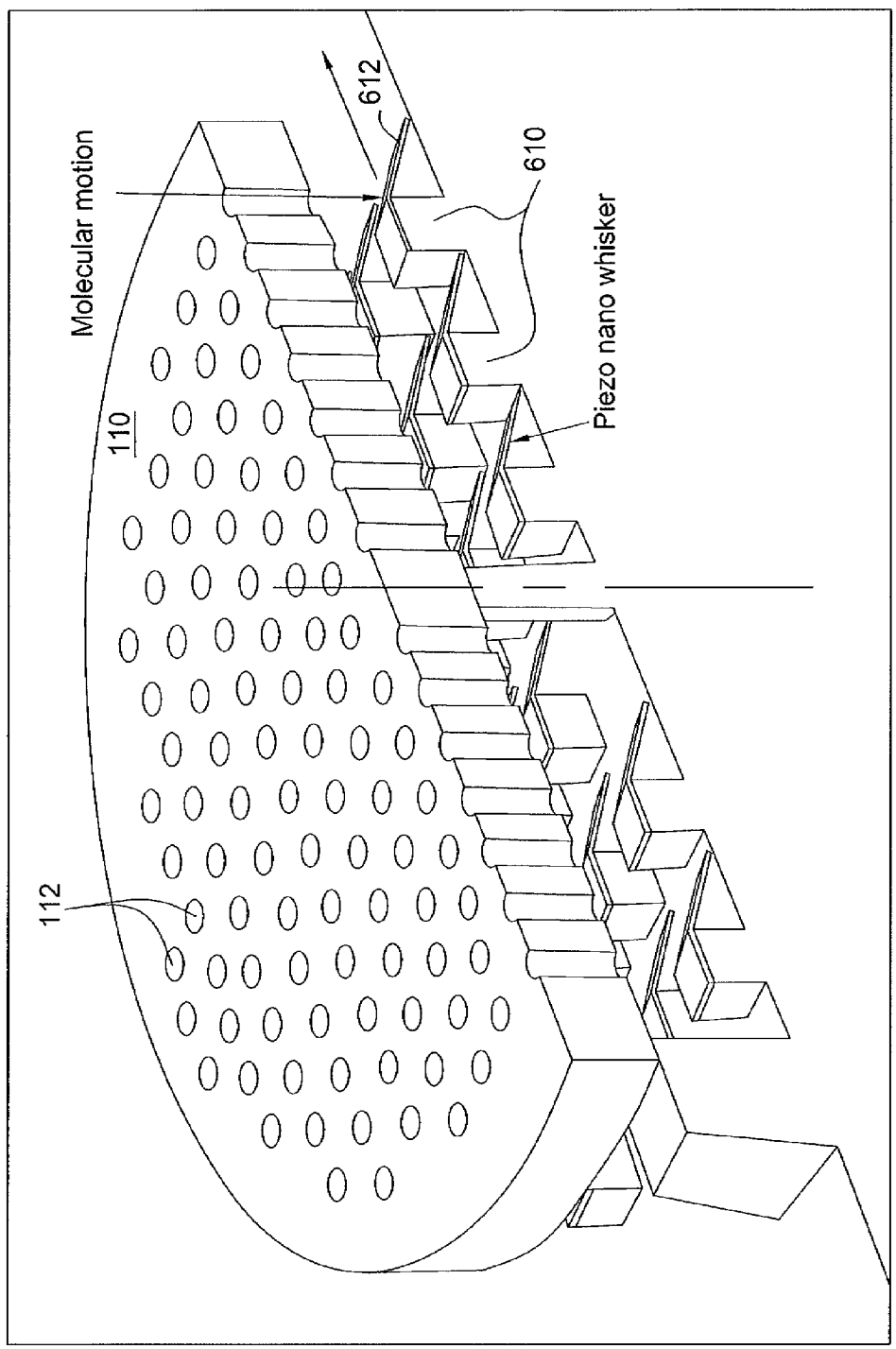
FIG. 6 illustrates an alternate embodiment where the turbine is replaced with a plurality or an array of piezo-nano whiskers.

FIG. 6 illustrates an alternate embodiment where the turbine is replaced with a plurality or an array of piezo-nano whiskers 610 (broadly an impacting structure). Each of the piezo-nano whiskers 610 has a flexible structure 612 that is shown in an inclined configuration that will create an electromechanical modulation when impacted by molecules entering the cavity through the plate holes 110. The electromechanical modulation of the piezo nano whiskers by the impacting molecules, generates the release of electrons by the flexing of the piezo substrate material (atomic lattice), generating electrons that then can be collected. The slope, size, shape and orientation of the piezo nano whiskers could be designed to help exit the (post impact), exhaust molecules out of the energy conversion volume and through the circumferential aperture similarly to the turbine configuration.

Figure 7:
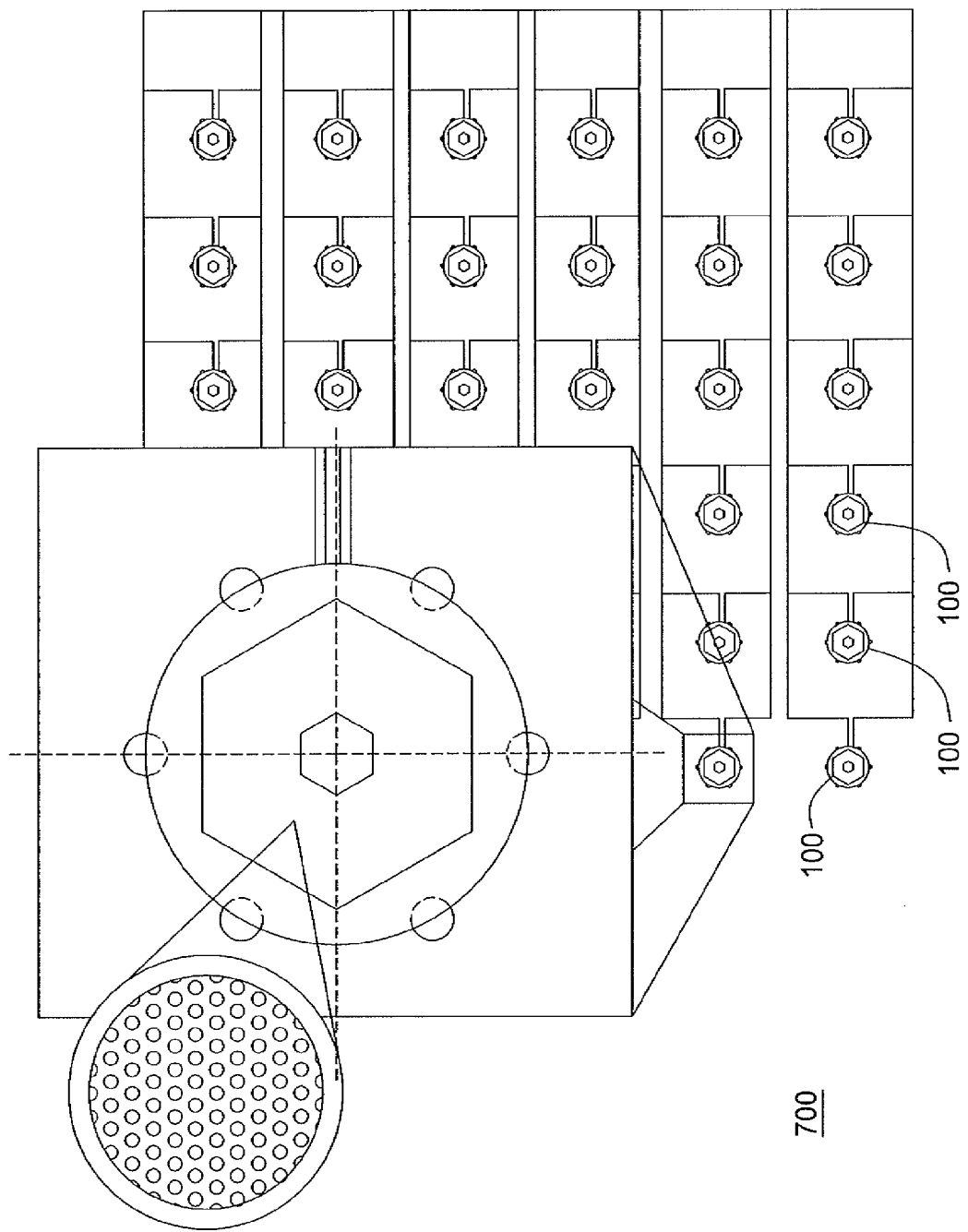
FIG. 7 illustrates an example array of devices for collecting molecular energy that can be used to collect energy over a large surface area.

As discussed above, the generated electricity can be collected from device 100 to trickle charge an energy storage device, e.g., a battery, or super capacitor that is used to power a sensor. FIG. 7 further illustrates an example energy collecting array 700 of devices 100 that can be used to collect energy over a large surface area.

While various embodiments of the energy generating component of this device have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An energy collecting device, comprising:
 a plate layer having a plurality of perforations for receiving a plurality of molecules;
 a molecular energy collecting layer, coupled to the plate layer, having an impacting structure for receiving the plurality of molecules; and
 a substrate layer, coupled to the molecular energy collecting layer, having a conductor wire coil for collecting electrons that are generated when the plurality of molecules impacts the impacting structure.

2. The energy collecting device of claim 1, wherein each of the plurality of perforations has an opening size that is approximately 7.1 nanometers.

3. The energy collecting device of claim 1, wherein the plurality of perforations is spaced approximately 10 nanometers apart.

4. The energy collecting device of claim 1, wherein each of the plurality of perforations has a first tapered opening on one end of the perforation.

5. The energy collecting device of claim 4, wherein each of the plurality of perforations has a second tapered opening on another end of the perforation.

6. The energy collecting device of claim 1, wherein the impacting structure comprises a turbine.

7. The energy collecting device of claim 1, wherein the turbine spins in response to the plurality of molecules impacting the turbine.

8. The energy collecting device of claim 6, wherein the turbine comprises a plurality of turbine blades.

9. The energy collecting device of claim 8, wherein the plurality of turbine blades are curved.

10. The energy collecting device of claim 6, wherein the substrate layer comprises a turbine bearing pin for supporting the turbine.

11. The energy collecting device of claim 1, wherein the substrate layer comprises a plurality of columns for supporting the plate layer.

12. The energy collecting device of claim 1, wherein the molecular energy collecting layer comprises a peripheral circumference aperture for allowing the plurality of molecules to exit the energy collecting device.

13. The energy collecting device of claim 1, wherein the impacting structure comprises a plurality of piezo-nano whiskers.

14. The energy collecting device of claim 1, wherein each of the plurality of piezo-nano whiskers has an inclined structure to create an electromechanical modulation.

15. The energy collecting device of claim 1, wherein each of the plate layer, the molecular energy collecting layer, and the substrate layer is made from silicon.

16. The energy collecting device of claim 1, wherein each of the plate layer, the molecular energy collecting layer, and the substrate layer is made from graphene.

17. An energy collecting array, comprising:
 a plurality of energy collecting devices, where each of the plurality of energy collecting devices comprises:
  a plate layer having a plurality of perforations for receiving a plurality of molecules;
  a molecular energy collecting layer, coupled to the plate layer, having an impacting structure for receiving the plurality of molecules; and
  a substrate layer, coupled to the molecular energy collecting layer, having a conductor wire coil for collecting electrons that are generated when the plurality of molecules impacts the impacting structure.

18. The energy collecting array of claim 17, wherein each of the plurality of perforations has an opening size that is approximately 7.1 nanometers.

19. The energy collecting array claim 17, wherein the plurality of perforations is spaced approximately 10 nanometers molecule diameters apart.

20. A method of collecting molecular energy, comprising:
 providing a plate layer having a plurality of perforations for receiving a plurality of molecules;
 providing a molecular energy collecting layer, coupled to the plate layer, having an impacting structure for receiving the plurality of molecules; and
 providing a substrate layer, coupled to the molecular energy collecting layer, having a conductor wire coil for collecting the molecular energy that is generated when the plurality of molecules impacts the impacting structure.

* * * * *